United States Patent
Hanna et al.

[11] Patent Number: 5,449,301
[45] Date of Patent: Sep. 12, 1995

[54] SHUNT CONNECTOR

[75] Inventors: Taj F. Hanna, Hummelstown; Stanley W. Olson, East Berlin; David E. Whiting, Dillsburg, all of Pa.

[73] Assignee: Berg Technology, Inc., Reno, Nev.

[21] Appl. No.: 153,630

[22] Filed: Nov. 17, 1993

[51] Int. Cl.6 .......................................... H01R 31/08
[52] U.S. Cl. .................... 439/510; 439/513; 439/817
[58] Field of Search ............... 439/507, 508, 509, 510, 439/511, 512, 513, 514, 668, 817, 823, 840, 854

[56] References Cited

U.S. PATENT DOCUMENTS

| | | |
|---|---|---|
| 3,932,013 | 1/1976 | Yeager et al. |
| 4,070,557 | 1/1978 | Ostapovitch ...................... 439/513 |
| 4,383,724 | 5/1983 | Verhoeven. |
| 4,392,702 | 7/1983 | Walkup. |
| 4,470,651 | 9/1984 | Schwab. |
| 4,470,652 | 9/1984 | Schwab ............................. 439/509 |
| 4,482,198 | 11/1984 | Crowley ............................ 439/510 |
| 4,516,817 | 5/1985 | Peters ................................ 439/510 |
| 4,602,834 | 7/1986 | Hahn et al. ....................... 439/510 |
| 4,883,430 | 11/1989 | Siemon et al. .................... 439/510 |
| 5,169,337 | 12/1992 | Ontega et al. .................... 439/510 |

OTHER PUBLICATIONS

"DuPont Connector Systems; Berg Elecronics; Product Catalog A; Minitek II Shunts, pp. 9–6 and 9–7; Mini–Jump" Shunts BergCon© System, pp. 13–44 and 13–45.

Primary Examiner—Larry I. Schwartz
Assistant Examiner—Hien D. Vu
Attorney, Agent, or Firm—Woodcock, Washburn, Kurtz, Mackiewicz & Norris

[57] ABSTRACT

A shunt connector provides for electrical connection of a pair of adjacent terminal pins inserted into a housing. A spring contact having a convex bowed body portion extends into a cavity in the housing where the pins are inserted. The terminal pins are inserted into the housing along an axis which is substantially transverse to the longitudinal axis of the spring contact. The spring contact is resilient such that the body engages the terminal pins and pressure engagement is maintained between the spring body and the pins which ensures that a proper electrical connection is made. The spring contact comprises a conducting material such that the pins are shorted upon contacting the spring.

14 Claims, 2 Drawing Sheets

SHUNT CONNECTOR

FIELD OF THE INVENTION

The present invention relates generally to electrical connectors. More particularly, this invention relates to a jumper or shunt connector for providing an electrical connection between two terminal pins inserted into the shunt.

BACKGROUND OF THE INVENTION

Shunt or jumper connectors are known in the art which provide an electrical connection between two adjacent electrically conductive terminal pins inserted into the device. Upon insertion of the terminal pins into the shunt device, electrical connection is established when the pins contact a conducting member or the like disposed within the device such that the flow of electricity between the pins is shorted in a known manner. The shunt device may be used to provide a permanent electrical connection to a printed circuit board or the like or may be used to provide only a temporary connection depending on the circuit requirements.

The trend in the connector industry is to provide a shunt connector comprising an insulating housing having a plurality of conductive contacting elements disposed therein. The insulating housing provides protection from the environment for the contacting elements such that the risk of short-circuiting is minimized.

One such shorting device is disclosed in U.S. Pat. No. 4,470,651—Schwab. Schwab discloses a modular electrical shunt comprising an insulating housing which is formed of two halves joined together such that a cavity is formed within the housing. A convex bowed dual-beam leaf spring is disposed in the cavity such that the convex body portion of the leaf spring extends longitudinally outward into the cavity from opposite edges of the leaf spring. The edges of the leaf spring are disposed against the housing for retaining the spring in the cavity. The terminal pins are inserted into grooves in the housing along an axis which is parallel to the longitudinal axis of the leaf springs such that the pins engage contacting surfaces at the outermost bowed portion of the leaf spring for creating a short between the terminal pins.

Further disclosure of shunts or jumpers is provided in Walkup, U.S. Pat No. 4,392,702 and Crowley, U.S. Pat. No. 4,482,198. These devices also comprise a housing structure for electrically connecting an array of adjacent terminal pins to a plurality of contacting elements disposed within the housing. Similar to that of Schwab, convex bowed contacting elements are disposed in the device such that the pins are inserted in a direction which is parallel to the longitudinal axis of the contacting element and the pins make contact only at the apex of the outermost bowed portion of the convexly curved pin-gripping portions.

Since the pins in these known devices are inserted along an axis which is parallel to the longitudinal axis of the spring, if the terminal pins are not substantially aligned in parallel with each other along the plane of insertion into the housing there is a possibility that one of the pins will not contact the outermost bowed portion of the contacting element, thus resulting in a malfunctioning of the shunt connector. To obviate this problem, Schwab and Crowley disclose a hole or slot in the bowed leaf spring such that the contact member functions as two contact beams which are connected by transverse cross bars. Thus, each contact beam element provides for relatively unrestricted, independent deflection by the spring in each area which contacts a pin.

However, several problems associated with these shorting devices have been recognized. The manufacture of a shunt connector comprising a spring contacting member having a hole or slot so as to ensure that the spring contact functions as two contact beams is costly and complex. Also, these known shorting devices are composed of several parts, thus further increasing the cost and complexity of the manufacture and assembly of the device prior to its use.

Therefore, there is a need for a shunt connector which is comprised of a minimal number of parts and may be manufactured and assembled easily and less costly and which provides a spring contacting element which ensures that a proper electrical connection is made between the terminal pins inserted into the device. The present invention provides a shunt or jumper which satisfies this need.

SUMMARY OF THE INVENTION

A shunt connector comprises an insulating housing having a cavity disposed therein and further having means for receiving a pair of adjacent terminal pins which are inserted into the housing along an insertion axis. A convex bowed spring contact comprising a conducting material is disposed in the cavity of the housing. The spring contact has a body extending longitudinally outward into the cavity to engage the terminal pins and to maintain pressure engagement between the terminal pins and the spring contact. The spring contact is disposed in the cavity such that the longitudinal axis of the spring contact is substantially transverse to the insertion axis of the terminal pins.

In accordance with the present invention, the shunt connector provides an electrical connection between terminal pins inserted into the device so as to short the flow of electricity between the pins. Accordingly, such a device may be used to provide a permanent or temporary short of terminal pins connected to a printed circuit assembly or the like and may be easily and cost effectively configured to the requirements of the circuit board user.

DETAILED DESCRIPTION OF THE PREFERRED EMBODIMENTS

Figure 1:
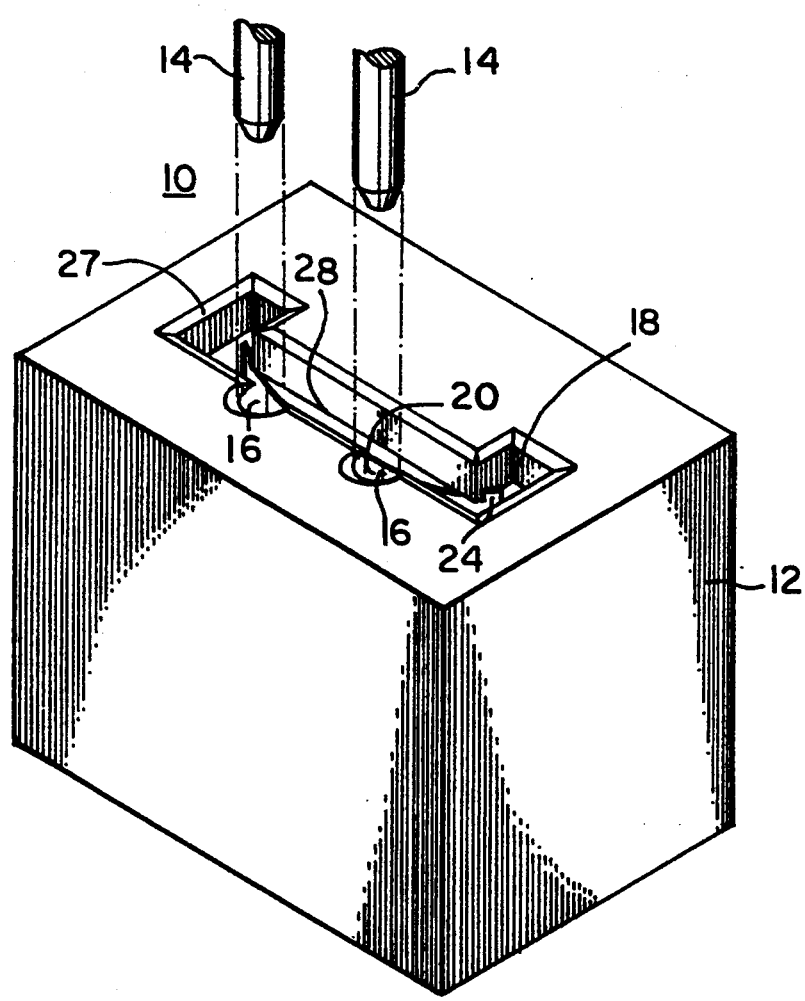
FIG. 1 shows a perspective view of a shunt connector in accordance with the present invention.
Figure 2:
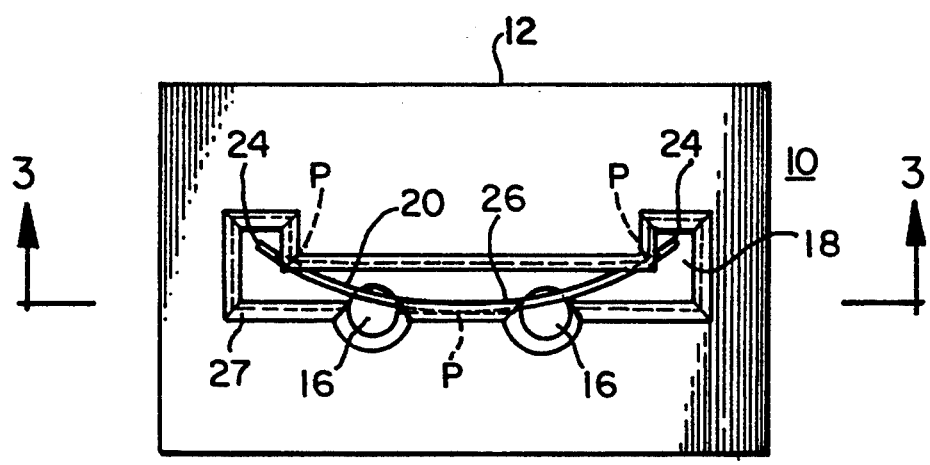
FIG. 2 shows a top view of the shunt connector of FIG. 1.
Figure 3:
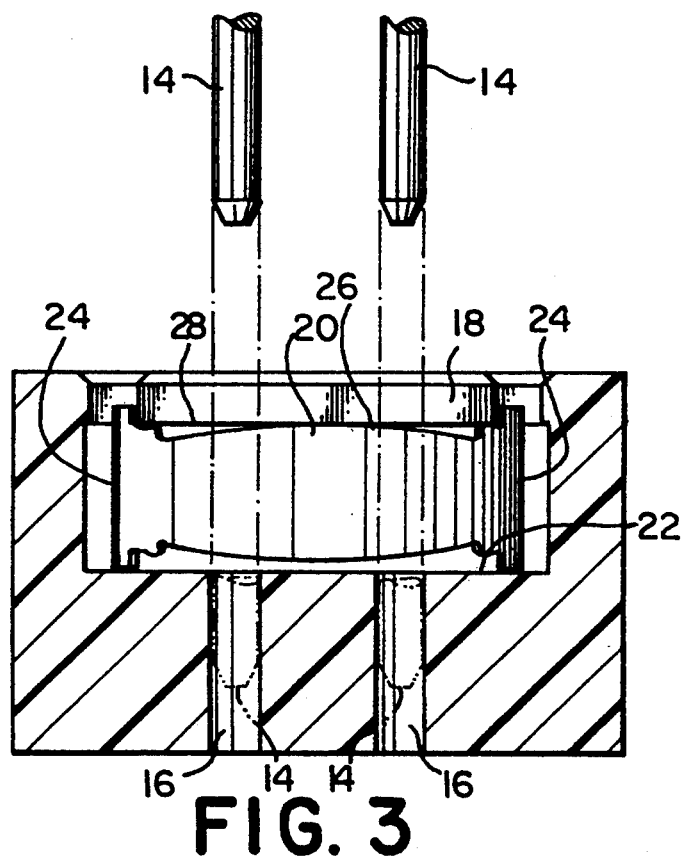
FIG. 3 shows a partial longitudinal cross-section of the shunt connector of FIG. 1, taken along lines 3—3 of FIG. 2, with a spring contact shown in perspective.

FIG. 1 depicts a shunt connector 10 in accordance with the present invention. Housing 12 receives two adjacent electrically conductive terminal pins 14 inserted into longitudinal bores 16 formed in the housing 12. In a preferred embodiment, housing 12 comprises an electrically insulating plastic material. As shown in FIG. 2, in a preferred embodiment of the present invention a portion of each of the longitudinal bores 16 is formed at cavity 18 formed in the housing 12. Electrically conducting spring contact 20 is disposed in cavity 18. As shown in FIG. 3, taken along lines 3—3 of FIG. 2, shoulder 22 forms the bottom of cavity 18 such that when the spring contact 20 is inserted into cavity 18 it comes to rest on shoulder 22.

Figure 4:
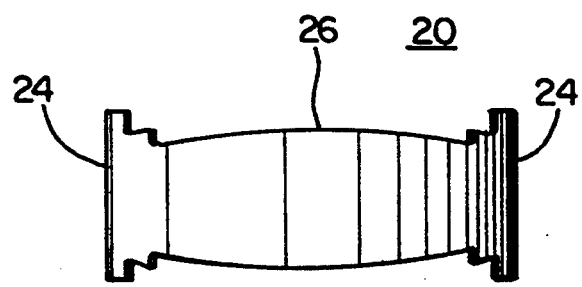
FIG. 4 shows a spring contact in accordance with the present invention.

As shown in FIG. 4, spring contact 20 has a pair of edges 24 and a body 26 extending between edges 24. Spring contact 20 is manufactured as a bowed piece of conducting material, such as beryllium copper, stainless steel, or phosphor bronze. Spring contact 20 is a resilient member such that when it is inserted into cavity 18 in housing 12 the spring becomes slightly compressed inside of the cavity. The body 26 of the spring contact remains bowed along its longitudinal axis and extends outward into cavity 18 as shown in FIG. 2. Edges 27 of the housing 12 in the area where the cavity 18 and longitudinal bores 16 are formed are chamfered to guide the spring contact 20 into position during insertion into the cavity 18.

Upon insertion of spring contact 20 into cavity 18, the resiliency of the spring contact causes it to be biased against the portion of housing 12 which forms the walls of cavity 18. As shown in FIG. 2, in the embodiment shown spring contact 20 makes contact with housing 12 at least three points p such that the spring contact is held securely in housing 12. Spring contact 20 is inserted into the cavity and is secured under step portion 28 formed in the housing for retaining the spring contact in the cavity. Step portion 28 prevents the spring contact from being inadvertently withdrawn from the cavity under the force of friction between the spring contact and the terminal pins when the pins are taken out of the shunt connector.

As shown in FIG. 2, when spring contact 20 is disposed in cavity 18, the convex bowed body 26 extends outward into cavity 18 and at a location where a portion of each of the longitudinal bores 16 is formed at the cavity 18. Referring to FIG. 1, terminal pins 14 are inserted into housing 12 along the longitudinal axis of longitudinal bores 16. The axis corresponding to the longitudinal axis of the longitudinal bores is referred to herein as the insertion axis such that the pins 14 are inserted along the insertion axis.

Referring to FIGS. 2 and 3, spring contact 20 is disposed in cavity 18 such that the longitudinal axis of the spring contact is substantially transverse to the insertion axis of the terminal pins 14. As shown in FIG. 2, body 26 of spring contact extends into cavity 18 and substantially breaks the plane which includes the insertion axis of the terminal pins. Thus, when terminal pins 14 are inserted into longitudinal bores 16, the pins engage and make contact with body 26 at a location where the longitudinal bores 16 are formed at the cavity 18. Upon insertion of the pins into the housing, the apex of the bowed portion of spring contact 20 at the corresponding point p is biased toward the housing and the ends of the spring contact are slidably engaged upon the housing in the location of the other two points p such that the spring contact remains in contact with two points on the housing.

Spring contact 20 establishes an electrical connection between terminal pins 14 so as to short the flow of electricity between the pins. Spring contact 20 is biased against pins 14 such that both pins contact body 26 and the pins are electrically connected. Since the convex bowed body 26 extends into cavity 18 in such a manner that the resilient spring is biased against the terminal pins, if the pins are not substantially aligned in parallel the pins will still make contact with body 26.

Referring once again to FIG. 3, longitudinal bores 16 are shown as extending throughout the entire length of housing 12. Thus, in this embodiment probes may be inserted into the longitudinal bores from the bottom surface of the housing in order to determine if proper electrical connection is established between the terminal pins inserted into the housing. However, the present invention is not intended to be limited in this manner and it is only necessary that the longitudinal bores extend into the housing far enough such that the pins contact the spring contact disposed in the housing.

Thus, the present invention provides a low cost shunt connector which is easily manufactured with a minimum number of parts and which provides a temporary or permanent short for a pair of adjacent terminal pins which are inserted into the connector. A spring contacting element is simply inserted into and secured in a cavity in the connector housing such that a reliable electrical connection is formed between the terminal pins regardless of any misalignment of the terminal pins.

Although particular embodiments of the present invention have been described and illustrated herein, it is recognized that modifications and variations may readily occur to those skilled in the art. Consequently, it is intended that the claims be intended to cover such modifications and equivalents.

What is claimed is:

1. A shunt connector, comprising:
   a housing, said housing having a cavity and pin receiving means having an insertion axis, said pin receiving means for receiving a pair of adjacent terminal pins inserted into said housing parallel to said insertion axis; and
   a leaf spring contact comprising a conducting material disposed in said cavity, said spring contact having a longitudinal axis, said spring contact disposed in said cavity such that said longitudinal axis is substantially transverse to said insertion axis, and said spring contact bowed in a direction transverse to said insertion axis so that a bowed section of the spring contact is biased against the terminal pins when said pins are inserted into said housing,
   whereby the terminal pins are inserted into said housing substantially transverse to the longitudinal axis of said spring contact such that the terminal pins engage and make electrical contact with the bowed section of said spring contact.

2. The shunt connector of claim 1, wherein said pin receiving means comprises a pair of longitudinal bores.

3. The shunt connector of claim 2, wherein a portion of each said bore is formed at said cavity.

4. The shunt connector of claim 1, wherein said spring contact makes contact with said housing at least three points on said housing.

5. The shunt connector of claim 1, wherein said housing further comprises a step portion protruding into said cavity for retaining said spring contact in said cavity.

6. The shunt connector of claim 2, wherein said longitudinal bores extend throughout said housing.

7. The shunt connector of claim 1, wherein said housing comprises an insulating plastic material.

8. The shunt connector of claim 1, wherein said longitudinal axis is perpendicular to said insertion axis.

9. A shunt connector according to claim 1, wherein the housing and the spring contact are configured so that the terminal pins electrically contact a convex side of the bowed section of the contact spring.

10. A shunt connector according to claim 1, wherein the housing and the spring contact are configured so that ends of the spring contact engage the housing on a concave side of the spring contact.

11. A shunt connector, comprising:
an insulating housing having a cavity having an insertion axis, the cavity disposed therein to receive a pair of adjacent terminal pins inserted into said housing parallel to said insertion axis; and
a bowed leaf spring contact disposed in said cavity, said spring contact comprising a resilient convexly curved body having an apex at the outermost point of said body, said spring contact disposed in said cavity such that said apex is biased into contacting engagement with said housing and said apex remains biased toward said housing when the terminal pins are inserted into said housing, the spring contact bowed in a direction transverse to said insertion axis so that a bowed section of the spring contact is biased against the terminal pins when said pins are inserted into said housing.

12. The shunt connector of claim 11, wherein the ends of said body are slidably engaged upon said housing during insertion of the terminal pins into the housing and said spring contact remains in contact with two points on said housing when said terminal pins are inserted into said housing.

13. A shunt connector according to claim 11, wherein the housing and the spring contact are configured so that the terminal pins electrically contact a convex side of the bowed section of the contact spring.

14. A shunt connector according to claim 11, wherein the housing and the spring contact are configured so that ends of the spring contact engage the housing on a concave side of the spring contact.

* * * * *